United States Patent
Herner et al.

(10) Patent No.: US 9,412,899 B2
(45) Date of Patent: Aug. 9, 2016

(54) METHOD OF STRESS INDUCED CLEAVING OF SEMICONDUCTOR DEVICES

(71) Applicant: GLO AB, Lund (SE)

(72) Inventors: Scott Brad Herner, San Jose, CA (US); Linda Romano, Sunnyvale, CA (US); Daniel Bryce Thompson, Walnut Creek, CA (US); Martin Schubert, Sunnyvale, CA (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 14/550,121

(22) Filed: Nov. 21, 2014

(65) Prior Publication Data

US 2015/0144968 A1    May 28, 2015

Related U.S. Application Data

(60) Provisional application No. 61/907,487, filed on Nov. 22, 2013.

(51) Int. Cl.
| | |
|---|---|
| *H01L 29/267* | (2006.01) |
| *H01L 33/00* | (2010.01) |
| *H01L 23/00* | (2006.01) |
| *H01L 21/268* | (2006.01) |
| *H01L 21/78* | (2006.01) |
| *H01L 21/768* | (2006.01) |
| *B23K 26/40* | (2014.01) |
| *H01L 33/20* | (2010.01) |

(52) U.S. Cl.
CPC ............ *H01L 33/0095* (2013.01); *B23K 26/40* (2013.01); *H01L 33/20* (2013.01)

(58) Field of Classification Search
CPC .............................. H01L 21/78; H01L 21/822
USPC .......... 257/622, 625, 79, 89, 98; 438/33, 455, 438/458
See application file for complete search history.

(56) References Cited

U.S. PATENT DOCUMENTS

| | | |
|---|---|---|
| 2011/0159615 A1 | 6/2011 | Lai |
| 2012/0083059 A1 | 4/2012 | Hoshino et al. |
| 2013/0095260 A1 | 4/2013 | Bovatsek et al. |

FOREIGN PATENT DOCUMENTS

| | | |
|---|---|---|
| JP | 2006-245062 A | 9/2006 |
| KR | 10-2012-0033962 A | 4/2012 |
| WO | WO 2007-046656 A1 | 4/2007 |

OTHER PUBLICATIONS

International Search Report and Written Opinion recevied in connection with international application No. PCT/US2014/066899; mailed Mar. 27, 2015.
International Preliminary Report on Patentability for International Application No. PCT/US2014/066899, 9 pages, dated Jun. 2, 2016.

*Primary Examiner* — Kimberly Rizkallah
*Assistant Examiner* — Brian Turner
(74) *Attorney, Agent, or Firm* — The Marbury Law Group PLLC (57) ABSTRACT

A method of dicing semiconductor devices includes depositing a continuous first layer over the substrate, such that the first layer imparts a compressive stress to the substrate, and etching grooves in the first layer to increase local stress at the grooves compared to stress at the remainder of the first layer located over the substrate. The method also includes generating a pattern of defects in the substrate with a laser beam, such that a location of the defects in the pattern of defects substantially corresponds to a location of at least some of the grooves in the in the first layer, and applying pressure to the substrate to dice the substrate along the grooves.

9 Claims, 12 Drawing Sheets

X direction

METHOD OF STRESS INDUCED CLEAVING OF SEMICONDUCTOR DEVICES

FIELD

The embodiments of the invention are directed generally to separating or dicing semiconductor devices, such as light emitting diodes (LED), and specifically cleaving LEDs from a substrate using a combination of stress and laser induced defects.

BACKGROUND

LEDs are used in electronic displays, such as liquid crystal displays in laptops or LED televisions. Conventional LED units are fabricated by mounting LEDs to a substrate, encapsulating the mounted LEDs and then optically coupling the encapsulated LEDs to an optical waveguide.

Typically, numerous LEDs are fabricated simultaneously on a single wafer and then the wafer is diced to form individual LEDs. When dicing the individual LEDs from a sapphire substrate, the sapphire substrate is thinned to approximately 100 um and then etched or mechanically scratched to create scribe marks for a subsequent break step using an anvil. Alternatively, the scribe marks may be formed with a laser.

Fabricating individual LEDs using the conventional dicing methods may result in damage to the wafer and the LEDs. For example, a continuous GaN layer on a sapphire substrate imparts a compressive stress on the underlying sapphire substrate which can affect the curvature of the substrate and may lead to undesired breakage of the substrate and destruction of the LEDs on the substrate.

SUMMARY

One embodiment provides a method of dicing semiconductor devices which includes depositing a continuous first layer over the substrate, such that the first layer imparts a compressive stress to the substrate, and etching grooves in the first layer to increase local stress at the grooves compared to stress at the remainder of the first layer located over the substrate. The method also includes generating a pattern of defects in the substrate with a laser beam, such that a location of the defects in the pattern of defects substantially corresponds to a location of at least some of the grooves in the in the first layer, and applying pressure to the substrate to dice the substrate along the grooves.

DETAILED DESCRIPTION

The present inventors realized that prior art methods of singulating or dicing semiconductor devices, such as LED dies from substrates, such as wafers, may result in damage to the wafer and the singulated LEDs. The present inventors have also realized that LED devices may be advantageously fabricated with the use of a semiconductor submount, such as a silicon submount with integrated interconnects in the submount. The present inventors have further realized that the fabrication of LED devices having large numbers of LEDs, such as thousands, such as tens of thousands, such as hundreds of thousands, such as millions, such as tens of millions, may be efficiently and inexpensively fabricated with the use of asymmetrically shaped LED dies. In an embodiment, the first color (e.g., red) LED dies have a first asymmetrical shape, the second color (e.g., green) LED dies have a second asymmetrical shape and the third color (e.g., blue) LED dies have a third asymmetrical shape, where the first, second and third shapes are different from each other. In an embodiment, the submount comprises asymmetrical tubs which correspond to the asymmetrical LED dies. In another embodiment, the submount may be vibrated to aid in locating the asymmetrical LED dies into the asymmetrical tubs in the submount.

Compressive stresses up to 1 GPa may develop in GaN films grown on sapphire substrates depending on the thickness of the GaN film, the growth temperature and the dislocation density in the GaN film. In contrast, nanowire geometries typically have strain-free surfaces. However, due to the lattice mismatch between the sapphire substrate and the III-V and or II-VI compound semiconductor materials of the LED nanowire materials used in nanowire LED devices, the nanowire LEDs are typically not directly grown on the sapphire substrates. Rather the LED nanowires are grown on a continuous GaN film deposited on the sapphire substrate. Thus, both planar and nanowire LED devices can be fabricated on sapphire substrates.

However, as discussed above, the amount of stress in the underlying GaN film can affect the curvature of the wafer and in some cases lead to wafer breakage. Thus, in conventional scribe/break methods typically used to create GaN LED devices, wafer breakage should be carefully managed. Typically, the sapphire substrate is thinned to approximately 100 um and mechanically scratched or etched to create scribe marks for the subsequent break step using an anvil.

In some cases, mechanical dicing methods have been replaced by lasers. Laser scribing reduces breakage and allows for narrower dicing streets. This ultimately increases the die yield and the number of dies/wafer.

Another advantage of a laser is that the power and focus can be controlled to manage the depth of the scribe. The inventors have realized that is property of the laser can be combined with the compressive stress in the GaN films on the sapphire nanowires to create alternative device geometries that would be difficult to achieve by conventional laser scribe/break methods. In another embodiment, the anvil breakage step may be replaced with a more economical roller process. This embodiment results in a less expensive die separation process. It also results in the ability to grow dies on larger area sapphire substrates.

In an embodiment, streets are patterned through the LED device layers on a completed wafer of dies and etched from the top side of the wafer to the sapphire substrate. Device geometries can include conventional shapes, such as squares or low-aspect ratio rectangles, as well as high-aspect ratio geometries, non-rectangular shapes, or shapes for which the convex hull of perimeter points is larger than the total shape area. High-aspect-ratio geometries are suitable for extremely compact packages and are desirable, for example, for backlighting applications.

Figure 1A:
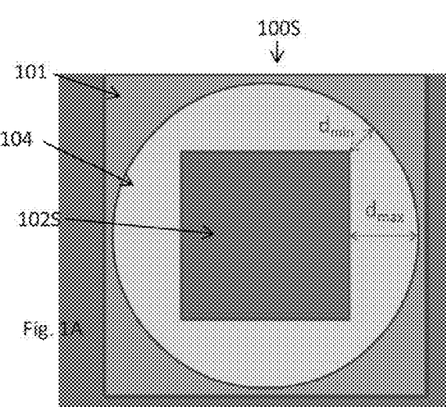
FIGS. 1A and 1B are schematic illustrations of a plan view and a side cross-sectional view, respectively, of a LED device with a square planar cross section.
Figure 1B:
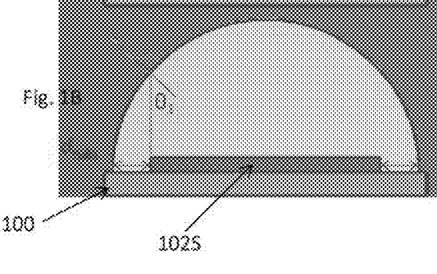
Figure 1C:
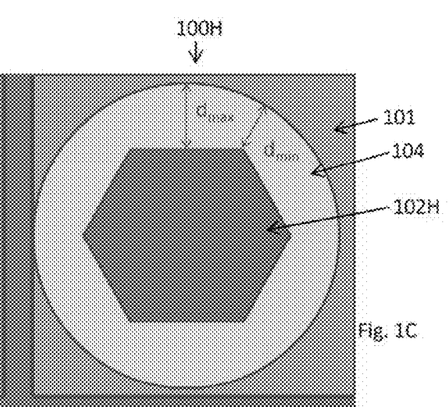
FIGS. 1C and 1D are schematic illustrations of a plan view and a side cross-sectional view, respectively, of a LED device with a hexagonal planar cross section.
Figure 1D:
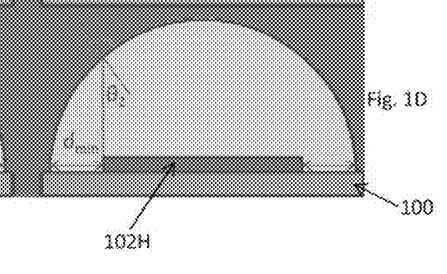

In an embodiment, non-rectangular shapes include shapes which may be more circular than rectangular in character, e.g. hexagons, which in a package (device) 100 having a dome lens 104 yields improved package-level extraction efficiency compared to a square die with the equivalent area as illustrated in FIGS. 1A-1D and 2. FIGS. 1A and 1B are schematic illustrations of a plan view and a side cross-sectional view, respectively, of a LED device 100S which includes a LED die 102S with a square planar cross section. FIGS. 1C and 1D are schematic illustrations of a plan view and a side cross-sectional view, respectively, of a LED device 100H which includes a LED die 102H with a hexagonal planar cross section. In both cases, the LED dies 102S, 102H are located on a substrate 101 and covered with a transparent, dome shaped lens 104.

In the embodiments, illustrated in FIGS. 1A-1D, the surface areas of the top surfaces of the LED dies 102S, 102H are the same. As illustrated in FIGS. 1A-1D, when the surface areas of the LED dies 102S, 102H are the same, the minimum distance $d_{min}$ from the hexagonal LED die 102H to the edge of the lens 104 is less than the minimum distance $d_{min}$ from the square LED die 102S to the edge of the lens 104. As a consequence in the difference in the minimum distance $d_{min}$, the incident angles $\theta_2$ for light emitted from edges of the hexagonal LED die 102H tend to be smaller than the incident angles $\theta_1$ for light emitted from edges of the square LED die 102S. This results is a smaller reflection coefficient. Therefore, light extraction efficiency will be greater for a LED device 100H with a hexagonal LED die 102H versus a LED device 100S with a square LED die 102S with the same light emitting surface area.

Figure 2:
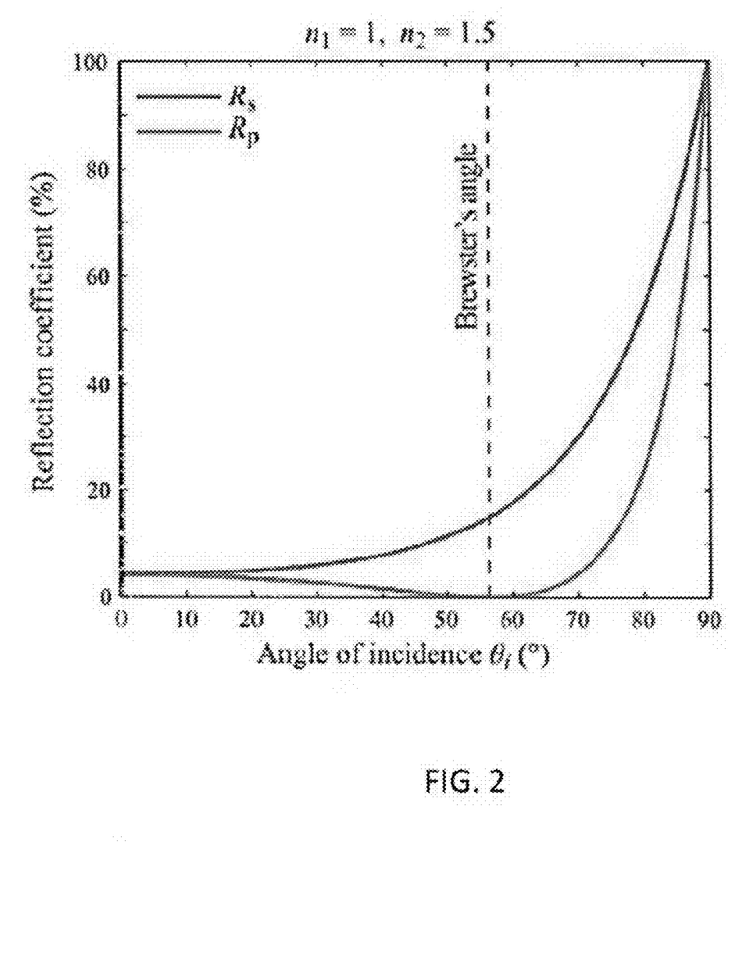
FIG. 2 is a plot of the reflection coefficient as a function of the angle of incidence for the LEDs of FIGS. 1A-1D.

FIG. 2 compares the reflection coefficient as a function of the angle of incidence for the LED devices 100S, 100H illustrated in FIGS. 1A-1D. As illustrated in FIG. 2, the reflection coefficient $R_P$ for the LED device 100H with the hexagonal LED die 102H is lower than the reflection coefficient $R_S$ for the LED device 100S with the square LED die 102S for all angles between 10° and 90°.

The improved package-level extraction efficiency is due to the reduction of emission into low-extraction modes approaching whispering gallery modes, e.g., light emitted from the corners of a square die. In addition, the projected beam from such a die has a more circular character, which is beneficial for lighting applications. Similarly, alternative geometries, e.g. triangles, improve die-level extraction efficiency due to the reduction of whispering gallery modes. Other sophisticated shapes may also be beneficial for forming tightly-packed LED arrays incorporating different die types.

In an embodiment, pulsed laser methods are used to form a defect pattern under the bottom side of the wafer which mimics the top surface street pattern. Preferably, the laser damage is limited to a few microns (e.g., less than 10 microns, such as 1-10 microns) below the surface of the wafer to create minimal damage in the wafer and weaken the wafer without shattering the wafer. In an embodiment, a roller is then used to separate the damaged wafers.

Figure 3A:
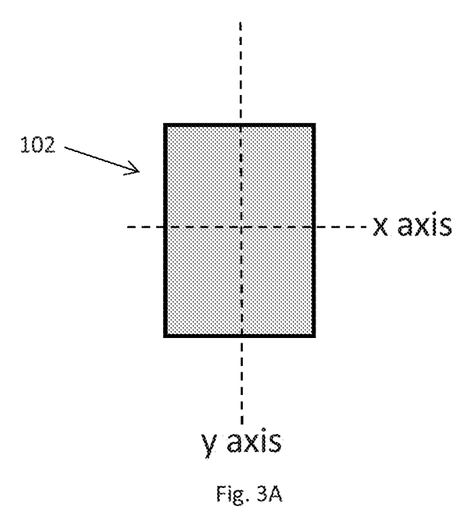
FIG. 3A is a schematic illustration of a top view of a rectangular shaped LED die with symmetry about the x and y axis.

FIG. 3A illustrates a top view of a rectangular shaped die with symmetry about the x and y axis. Standard singulation techniques involving thinning and then mechanically sawing wafers results in dies 102 that are symmetric about the x and y axes as shown in FIG. 3. Symmetry of an object is defined as the object having a mirror image across the line of the axis.

Figure 3B:
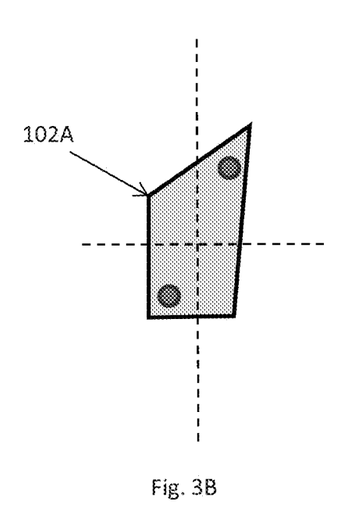
FIG. 3B is a schematic illustration of a top view of an asymmetrically shaped die according to an embodiment.

FIG. 3B illustrates an asymmetrically shaped die which may be fabricated according to the methods described below. As described in more detail below, asymmetrically shaped dies may be located in corresponding asymmetrically shaped tubs on a submount. In this manner, LEDs that emit light at of preselected wavelength/color may be uniquely located or arranged in a preselected pattern in a submount.

Figure 4A:
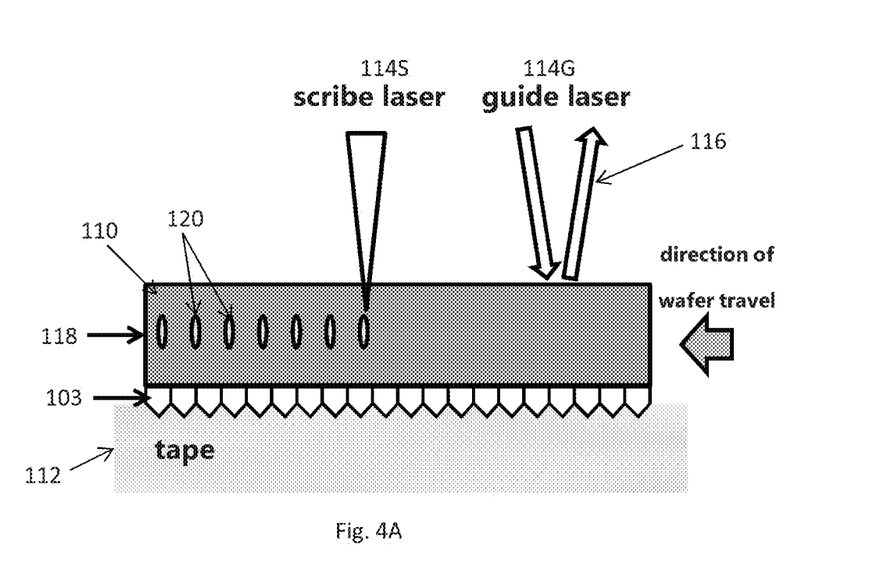
FIGS. 4A-4D are a schematic illustration of a plan view of steps in a method of singulating LED dies.
Figure 4B:
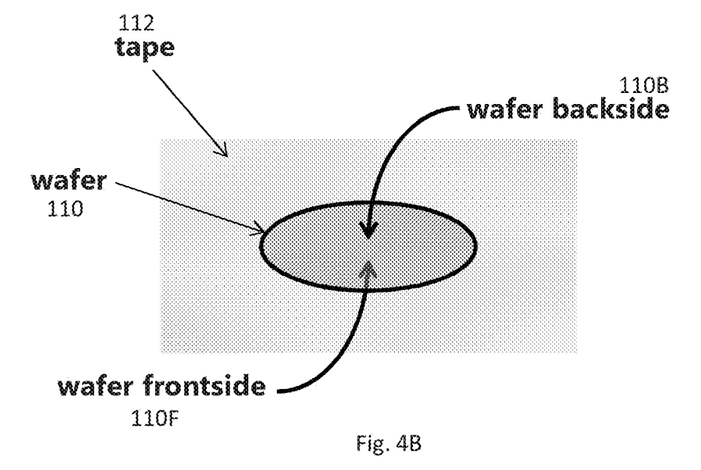

A laser defect generation and dicing technique known as Stealth Scribing™, enables the singulation of die shapes without symmetry as illustrated in FIG. 3B. The Stealth Scribing™ processes is illustrated in FIGS. 4A-D. The semiconductor device layers 103, such as LED layers, are formed on the front side 110F of a wafer 110, as shown in FIG. 4A. As illustrated in FIGS. 4A and 4B, the wafer is thinned and then mounted on a tape 112, front side (device side) 110F down. The smooth back side 110B of the wafer 110 is exposed.

Stealth Scribing™ involves a laser focused to an interior point in a wafer 110, resulting in a pattern defects 120 at the point of focus of the laser, as shown in FIG. 4A. As illustrated in FIG. 4A, two lasers, a guide laser 114G and a scribe laser 114S are typically used. The guide laser 114G measures the vertical height of the wafer 110 by reflecting light 116 off the smooth back surface 110B of the wafer 110. This measurement is fed back to the scribing laser 114S, which follows the guide laser 114G and focuses its energy at a consistent plane 118 inside the wafer 110. Preferably, the substrate is transparent to the scribing laser 114G. In an embodiment, the substrate is sapphire and the scribing laser 114S operates at a wavelength of approximately 532 nm.

Figure 4C:
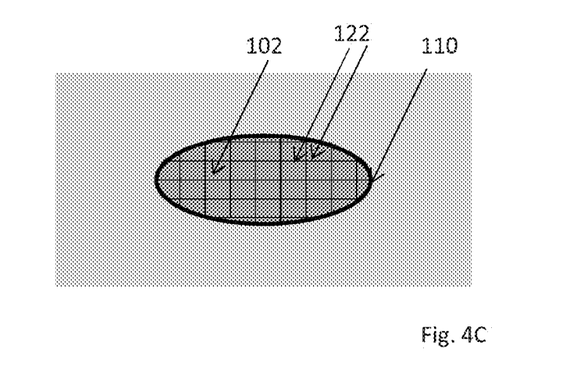

The scribe laser 114S is rastered around the wafer 110 in x-y locations, writing the shape of the LED dies 102 shown in FIG. 4C by placing defects 120 along the lines where the dies 102 will be broken. After laser "scribing" (i.e., writing) a pattern of defects 120 into the wafer 110, there is a pattern 122 of defects 120 within the wafer 110, but the wafer 110 is still whole. The defects 120 are typically not be visible to naked eye on the wafer 110.

Figure 4D:
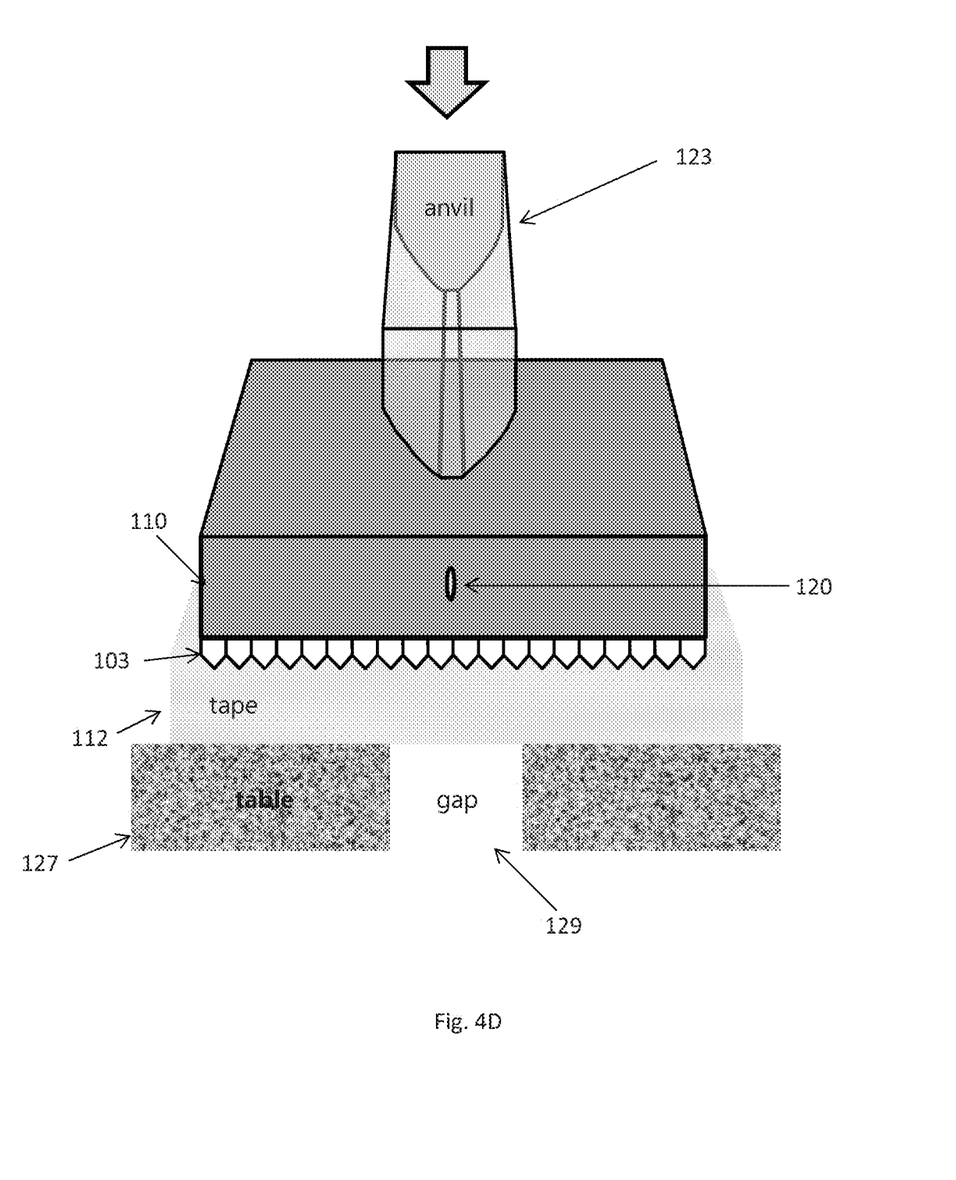

As illustrated in FIG. 4D, the LED dies 102 are singulated from the wafer by pressing on the back of the wafer 110 with an anvil 123. Preferably, the wafer is located on a table 127 or other suitable surface having a gap 129 opposite the anvil 123.

Figure 6:
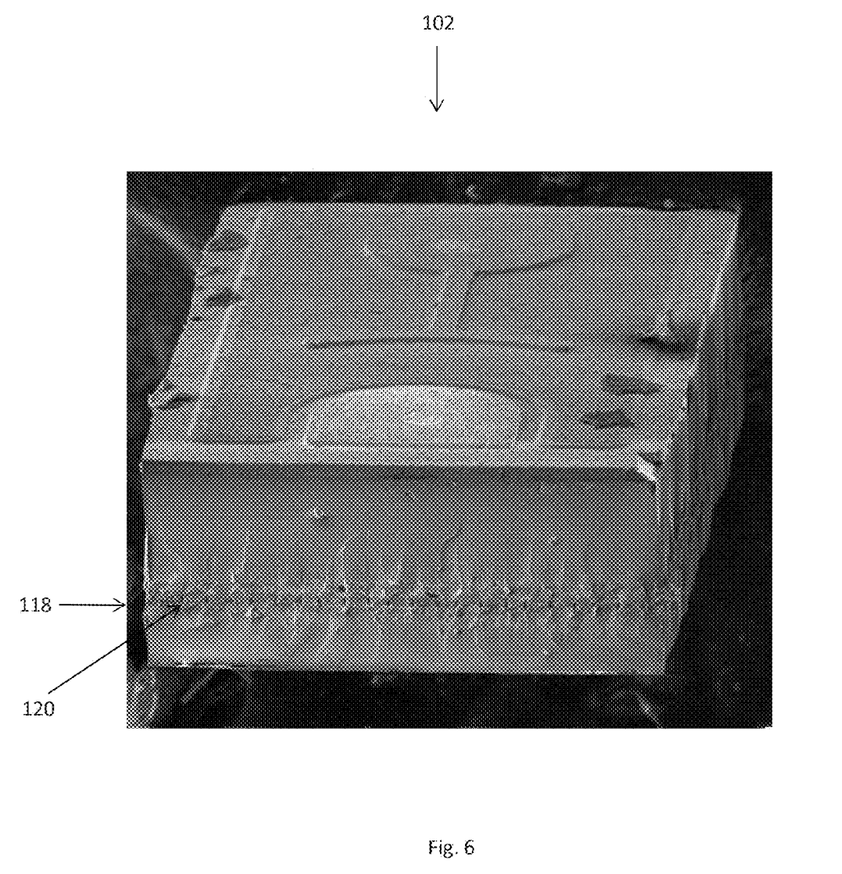
FIG. 6 is a photograph of a singulated LED die.

FIG. 6 is a photograph of a singulated die made according to the above method. The plane 118 of defects 120 is clearly visible in the photograph.

Thus, as described above, Stealth Scribing™ involves the application of internal defects to a wafer by laser focusing, and then anvil breaking the wafer along the lines of defects. Stealth Scribing™ uses preferred crystalline orientations for cleaving as there is still a minimum force needed for anvil breaking to break the wafer. "Preferred crystalline orientations" means there are certain orientations that will cleave preferential to other non-preferred orientations.

In one embodiment method of the present invention, the present inventors realized that etching of the continuous compressive stress layer which is uniformly compressively stressing the substrate, raises the local stress at etched grooves, which aids the dicing process after generating a defect pattern in the substrate using a laser. For example, a III-nitride buffer layer, such as a GaN buffer layer, on a sapphire substrate may be selectively etched to form street grooves which expose the substrate, creating local areas of increasing stress. Increasing the local stress decreases the force needed to break the substrate. Internal defects are then applied using the laser, as described above. Because of the increased local stress, the substrate can be broken with less force (e.g. roll breaking instead of anvil breaking), and can theoretically break in patterns inconsistent with the sapphire crystal preferred cleaving orientation.

In one embodiment, the method of dicing the substrate shown in FIGS. 5A-5E includes depositing a continuous first layer 105, such as a GaN buffer layer, over the substrate 110, such as a sapphire wafer. The first layer 105 imparts a compressive stress to the substrate.

Figure 5A:
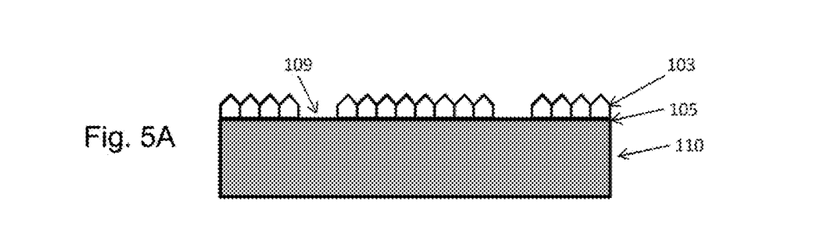
FIGS. 5A-5E are schematic illustrations showing the steps in methods of singulating LED dies according to an embodiment of the invention.
Figure 5B:
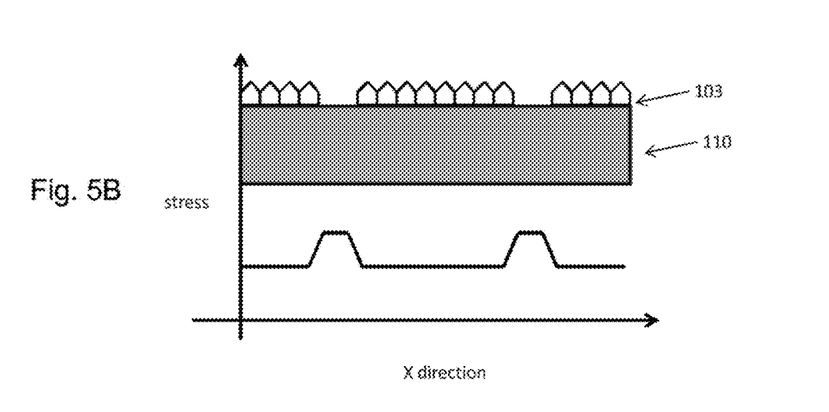

The method also includes etching grooves 109 in the first layer 105 to increase local stress at the grooves compared to stress at the remainder of the first layer located over the substrate, as shown in FIG. 5B. The step of etching grooves 109 comprises etching street grooves in inactive regions through the LEDs (i.e., LED layers) 103 and through the first layer 105 to expose the substrate and to define a pattern of individual LED dies on a first side of the substrate.

Figure 5C:
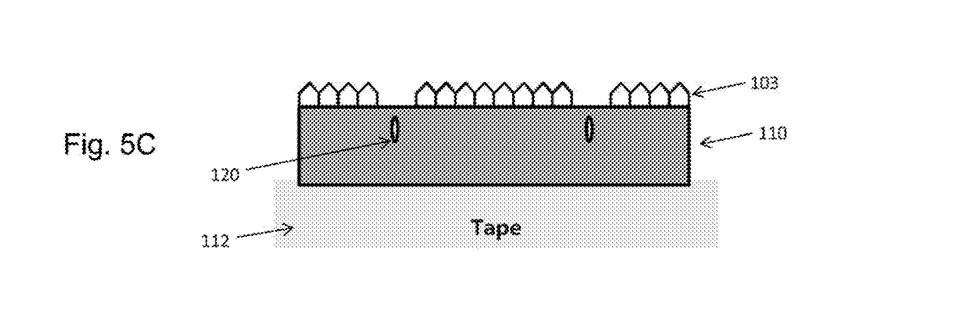
Figure 5D:
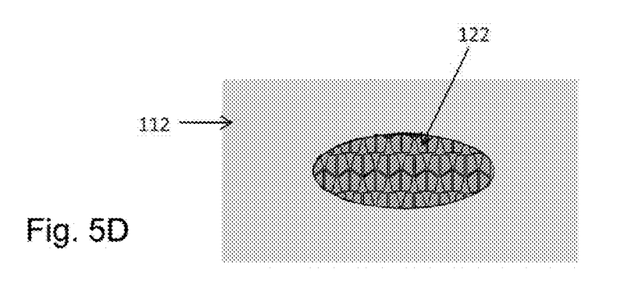

The method also includes generating a pattern 122 of defects 120 in the substrate with a laser beam, as shown in FIGS. 5C and 5D. The location of the defects 120 in the pattern 122 of defects substantially corresponds to a location of at least some of the grooves 109, and preferably all of the grooves, in the in the first layer 105. The street grooves 109 and the pattern 122 of defects 120 mimic a pattern of individual LED dies 102.

Figure 5E:
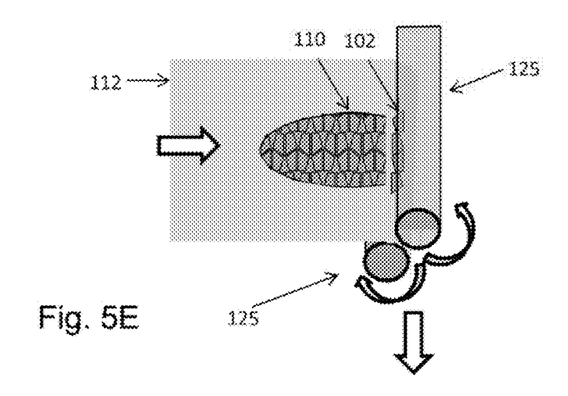

Finally, the method includes applying pressure to the substrate to dice the substrate along the grooves, as shown in FIG. 5E. The pressure may be applied by roll breaking using roller(s) 125 rolled on the substrate 110 to form LED dies 102.

Specifically, as illustrated in FIG. 5A, after fabricating the GaN buffer layer 105 and LED layers 103, either planar or nanowire, on the front side 110F of the substrate (e.g., sapphire wafer) 110, street grooves 109 are etched through the LED layers 103 and the buffer layer 105 down the surface 109 of the wafer 110 (the front 110F or device side of the wafer 110).

As illustrated in FIG. 5B, the compressive stress due to the continuous layer on the substrate, e.g. GaN on sapphire, results in peak stress concentrated in the streets 109 in the GaN buffer layer 105. This concentrated stress in the streets 109 aids in singulating the LED dies 102 in a controlled manner and reduces loss caused by cracks that might otherwise meander away from the streets 109 and damage adjacent dies 102.

The wafer 110 is then thinned and mounted front side 110F onto a tape 112 or another support, as shown in FIG. 5C, which keeps the singulated dies 102 from scattering once they are singulated. As further illustrated in FIG. 5C, laser damaged regions (i.e., defects) 120 may be introduced into the wafer 110 with a laser as described above. Damaged regions 120 may be introduced with the laser either through the top (device) side 110F or the bottom (back) side 110B of the wafer 110. The pattern 122 of defects 120 preferably comprises a region of defects located less than 10 microns below a surface of the substrate 110.

The patterns 122 of defects shown in FIG. 5D are for illustration purposes only. Other patterns may be produced as desired. The pattern 122 illustrated in FIG. 5D results in asymmetrically shaped LED dies 102 while the pattern 122 illustrated in FIG. 4C results in symmetrically shaped LED dies 102. The wafer 110 is weakened in the locations that define the shape of the LED dies 102.

The wafer 110 is then subjected to roll breaking with rollers 125, as shown in FIG. 5E. In an embodiment, two counter rotating rollers are used to singulate the LED dies 102. The substrate 110 may cleaved along a non-preferred crystalline cleaving orientation during the step of applying pressure to the substrate to dice the substrate along the grooves 109. With this method, LED dies 102 with symmetric and asymmetric die shapes can be made as shown in FIGS. 4D and 5E.

Figure 7:
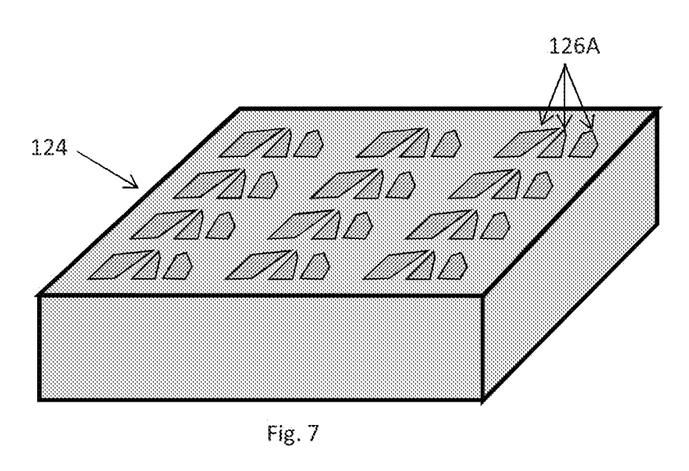
FIG. 7 is a perspective illustration of a submount according an embodiment.
Figure 8:
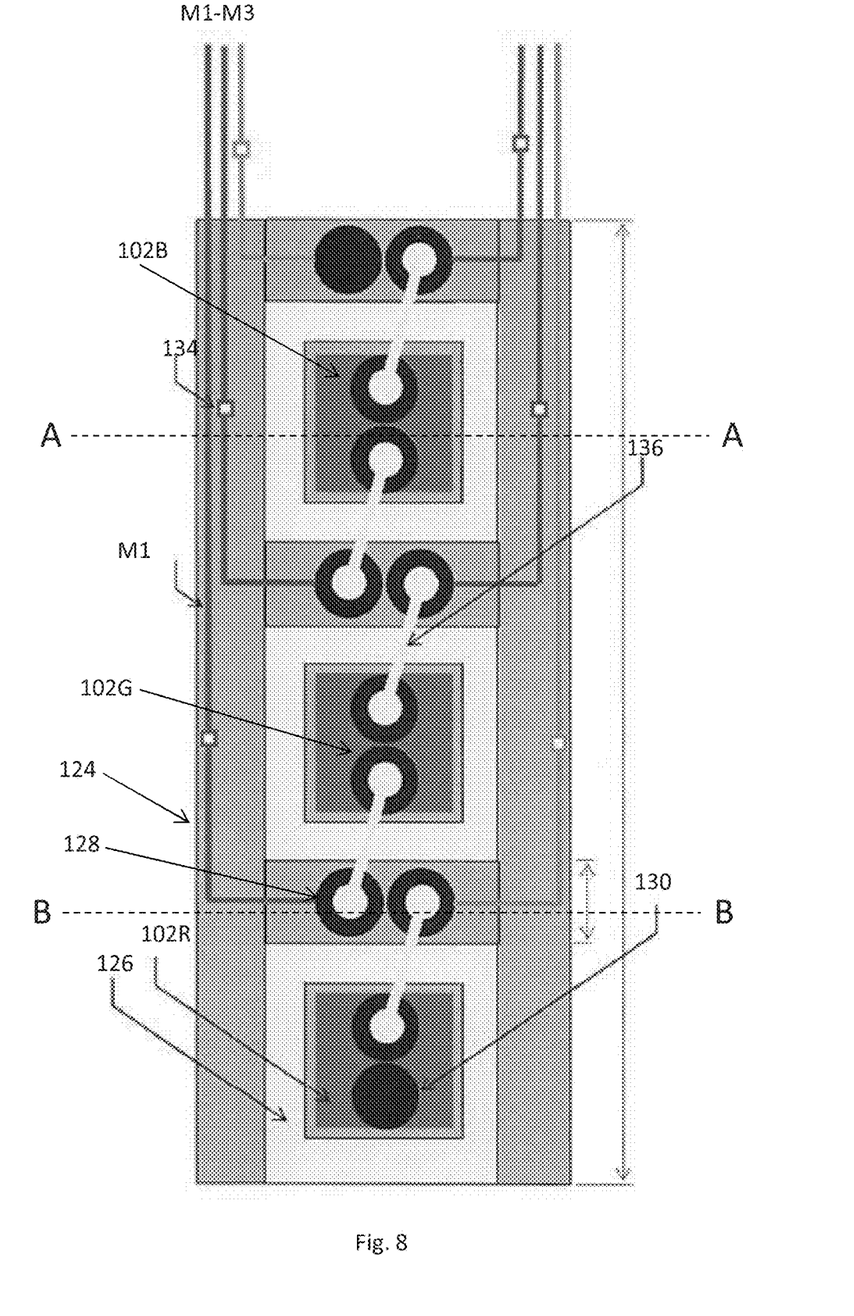
FIG. 8 is a plan view of a submount according to another embodiment.

FIGS. 7-11 illustrate submounts 124 according to other embodiments. In an embodiment, the submount 124 is fabricated with standard metal interconnects, described in more detail below, prior to attaching the dies 102. In an embodiment described in more detail below, the submount 124 includes symmetrical tubs 126 in which the LED dies 102 are located. In the embodiment illustrated in FIG. 7, the submount 124, includes asymmetrical tubs 126A with the same asymmetric shape as the asymmetrical LED dies 102A. Several different asymmetric tub 126A shapes can be etched into the submount 124 which allows for several different LED dies 102A to be integrated into the submount 124, as illustrated in FIG. 8. In an embodiment, the submount 124 is made of silicon.

Another embodiment is drawn to a method of integrating asymmetrical LED dies 102A into a submount 124 having asymmetrical tubs 126A as illustrated in FIG. 7. In this embodiment, the individual asymmetrical LED dies 102A are dispensed onto the submount 124 while the submount is vibrated. This agitation aids in the placement of the correct asymmetrical LED dies 102A fitting into the corresponding asymmetrical tub 126A. Preferably, only one combination of die and tub is possible. Also, the x-y asymmetry assures the correct side of the asymmetrical LED die 126A is "face up" (else the asymmetrical LED die 126A does not fall into the asymmetrical tub 126A). In an embodiment, when all the asymmetrical LED dies 126A are placed in the correct asymmetrical tub 126A, heat is applied to the submount 124 for eutectic bonding. Eutectic bonding is a metallurgical reaction between two different metals with heating in which the metal form an alloy at a temperature below the melting temperature of either of the metals. In an embodiment, a film of one metal is deposited on the bottoms of the asymmetrical LED dies 126A and a film of the other metal is deposited in the asymmetrical tubs 126A. An example of a suitable eutectic reaction for die attachment is Au—Sn. Gold and tin form an alloy upon heating to approximately 280° C.

In an embodiment, the metal interconnects are fabricated in the submount 124 before integrating the asymmetrical LED dies 102A. In this embodiment, the asymmetrical LED dies 102A can be wire bonded to the pad on the metal interconnects, as described in more details below. Wire interconnects on the submount 124 may be fabricated by standard silicon processing techniques prior to assembly of the LED device 100. After the asymmetrical LED dies 102A are affixed to the submount 124, the front side of the dies 124 may be electrically connected to the metal interconnects in the submount 124 by a direct write process, such as ink jet deposition of metal interconnects. After metal connection from the LED dies 102A to the submount, an encapsulant may be deposited over the LED dies 102A.

Alternatively, if there are no interconnects on the submount 124, the interconnects may be deposited from the asymmetrical LEDs 102A to the submount 124 by direct write via inkjet printing of metal and deposition and patterning of a photoactive polyimide material. That is, in this embodiment, all of the metal interconnects are fabricated after the LED dies 102A are assembled into the submount 124. Multiple layers of metal interconnects may be made by a direct write process using ink jet deposition of metal connects and deposition and patterning of a photoactive polyimide that acts as an insulator between the layers of metal interconnects.

As in the previous embodiment, after the asymmetrical LED dies 102A are connected to the submount 124, encapsulant can be deposited over the asymmetrical LED dies 102A with standard encapsulant techniques.

The above described fabrication processes are more cost effective to assemble devices with large numbers of LED dies 102A than existing methods involving printed circuit boards which require individual placement and attachment of LED dies 102, and individual wire bonding of the individual LED dies 102 to metal interconnects on the printed circuit board.

Figure 9:
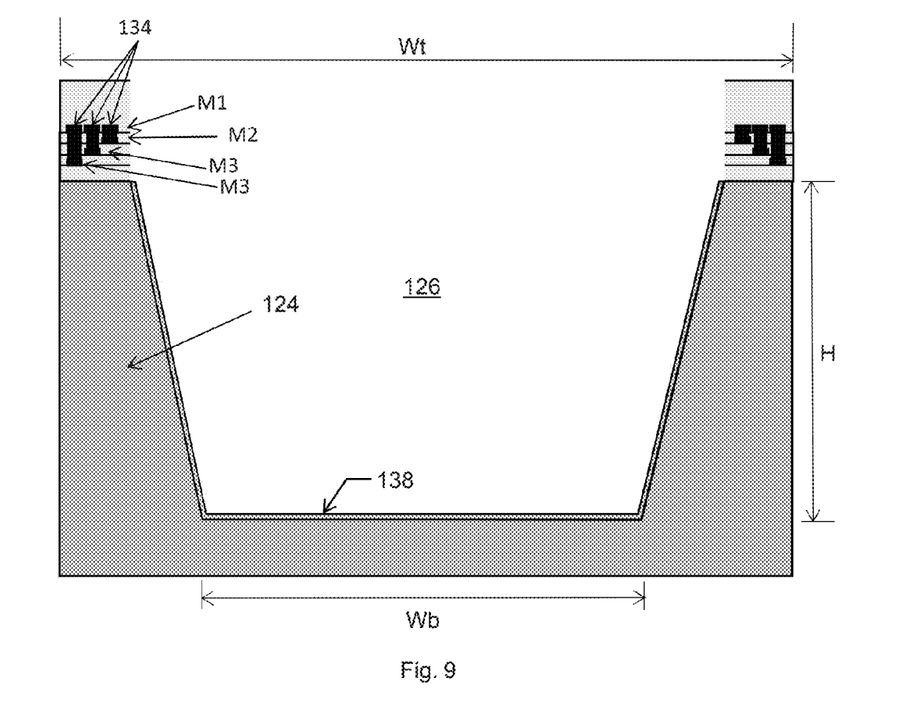
FIG. 9 is schematic illustration of a cross-sectional view of the submount of FIG. 8 through line AA.
Figure 10:
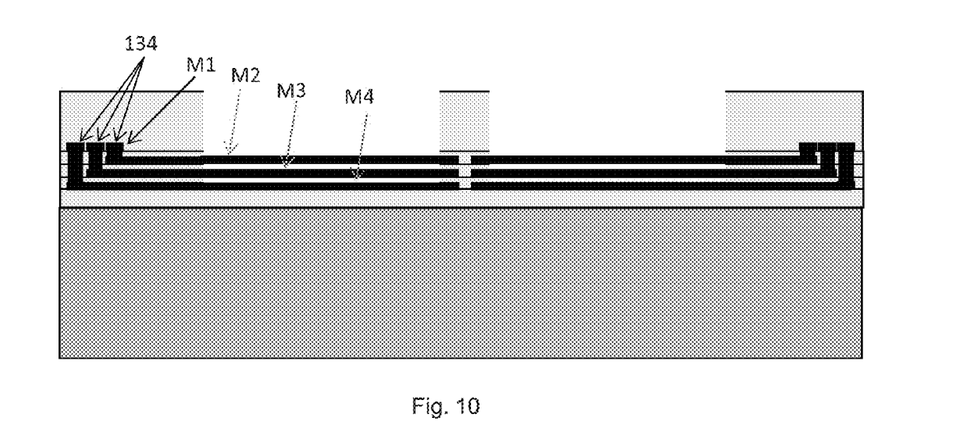
FIG. 10 is schematic illustration of a cross-sectional view of the submount of FIG. 9 through line BB.
Figure 11:
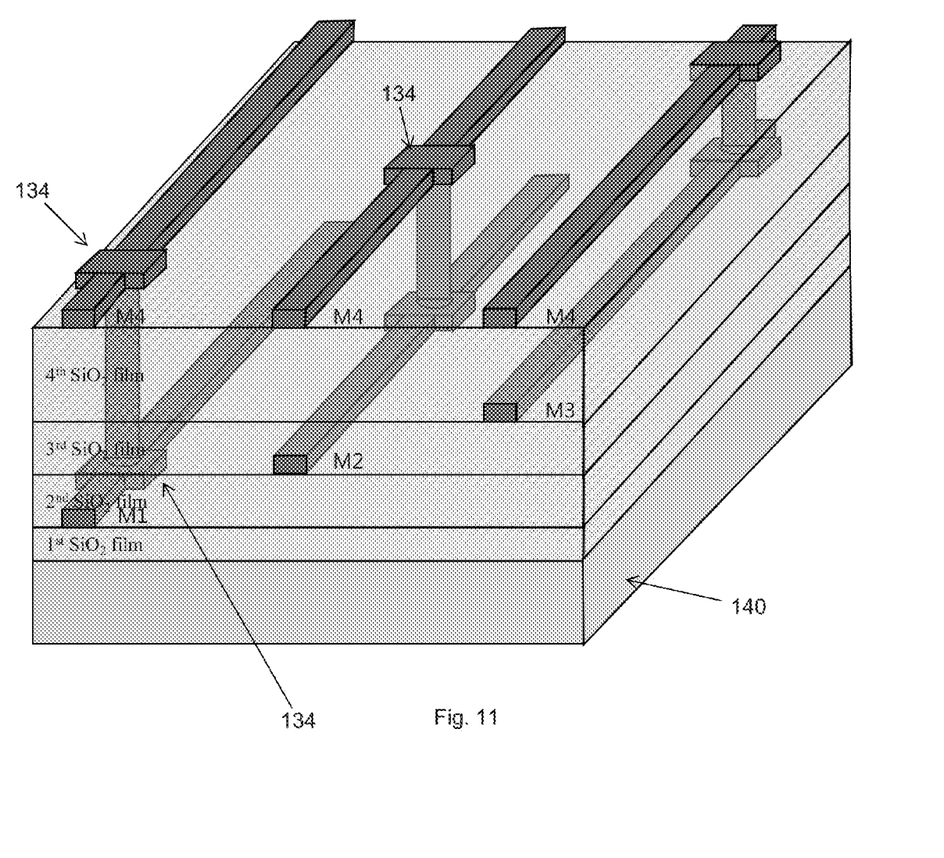
FIG. 11 is a three dimensional cut away view illustrating a portion of the submount of FIG. 8.

FIGS. 8-11 illustrate a silicon submount 124 suitable for use with an integrated back light unit according to another embodiment. Features of the submount 124 include integrated multilevel interconnect fabrication with the submount, selective Ni/Ag plating of the tubs onto highly doped Si, and deep Si etch of tubs over existing multilevel interconnect stacks. FIG. 8 is a plan view of the submount 124 while FIGS. 9 and 10 are cross-sectional views of the submount 124 through lines AA and BB, respectively. The cross section illustrated in FIG. 9 is through one of the tubs 126 prior to attachment of an LED die 102. The cross section illustrated in FIG. 10 is through a pad area between tubs 102. FIG. 11 is a three dimensional cut away view illustrating a portion of the submount of FIG. 8.

Each symmetric tub 126 is configured to hold an LED die 102. As illustrated in FIG. 9, the tubs 126 are preferably tapered. That is, the bottom of the tub 124 in which each LED die 102 is located has a width $w_b$ equal to or slightly larger than the width of the LED die 102 while the top of the tub 126 has a width $w_t$ larger than $w_b$. The top width $w_t$ is larger than $w_b$ to aid in locating the LED dies 102 into the tubs 126.

In the embodiment illustrated in FIG. 8, the submount 124 includes three symmetric tubs 126. In an embodiment, a first tub 126 includes a red LED die 102R, a second tub 126 includes a green LED die 102G and the third tub includes a blue LED die 102B. However, all of the tubs 126 may include LED dies that emit the same color of light. Further, the submount 124 is not limited to three tubs 126. The submount 124 may have any number of tubs 126, such as 2-72, such as 3-60 tubs, such as 6-48 tubs. In an embodiment, a segment is defined as three tubs 126, typically including one red LED die 102R, one green LED die 102G and one blue LED die 102B. The submount may include 1-24 segments, such as 2-20 segments, such as 3-16 segments.

As illustrated in FIG. 8, the submount 124 includes metal pads 128 between the tubs 126 for wire bonding. By placing the metal pads 128 between the tubs 126 rather than along the sides as in conventional submounts, the width of the submount can be reduced. Each LED die 102 includes corresponding bond pads 130. Wire bonds 136 connect the metal pads 128 on the submount 124 to the corresponding bond pads 130 on the LED dies 102.

Also included in the submount 124 are metal lines M1-M4 which are used to supply current to the LED dies 102. While four lines are shown, other number of lines may be used. As illustrated in FIGS. 10 and 11, the metal lines M may be located in different levels within the submount 124 such that there are four levels M1, M2, M3, M4. The submount 124 also includes metal landing pads 134 with vias on top to bring power to the metal lines M1, M2, M3, M4. For example, lines M4 may be bus lines which provide current to electrode lines M1, M2, M3 which connect to the LED die. As illustrated, the metal landing pads 134 are square. However, the metal landing pads 134 may be circular, rectangular, hexagonal or any other suitable shape. Also illustrated in FIG. 9 is a metal film 138 lining the tub 126. The metal film 138 material (e.g., Au—Sn or Ni—Al) is selected to react with a second metal film (not shown) on the bottom of the LED dies 102 to form a eutectic bond as discussed above.

In an embodiment, the submount is made of silicon and includes integrated interconnects for an integrated back light unit. In an embodiment:

1. Red, green, and blue LED dies 102R, 102G, 102B are 6-12, such as 8-10 mils square, e.g., a maximum of 210 µm. However, in alternative embodiments, other size LED dies 102 may be used;
2. A 365 nm contact lithography stepper may be used to produce line/spaces of 5 µm/5 µm;
3. The tubs 126 may be 200-400 µm deep, such as 300 µm deep with 65-85 degree sloped sidewalls, such as 80 degree sidewalls;
4. The tubs 126 preferably have reflectors (i.e., film 138) on the bottom and sidewalls;
5. The street widths are less than 150 µm, such as 100 µm, if conventionally scribed and may be less if stealth scribed;
6. Al may be used as a hard mask when deep etching a Si submount. In alternative embodiments, a more refractory metal than Si, such as Cr, Ti, TiN, TiW, or W may be used on top of Al to resist the Si etch.

In an embodiment, the submount 124 may be 530 µm wide and 33,120 µm long, not including pads to contact to the outside for power. Add 300 µm to the length for the 6 pads that will attach to the outside world and the submount 124 length is 33,420 µm. On a 200 mm Si wafer with 3 mm edge exclusion, this enables 1355 submounts 124 per wafer.

An embodiment is drawn to a method of making the above submount 124. One aspect of the embodiment of the method includes the following process flow:

1. Starting material: mechanical grade highly doped 200 mm Si wafers;
2. Deposit or grow 1000 Å $SiO_2$ film on the Si wafer; thickness can be anywhere from 200 Å to 10 µm. Alternately, photoactive polyimide can be used in place of the $SiO_2$, or other dielectrics, such as low-k SiCOH, SiN, $Al_2O_3$, etc dielectrics.
3. Pattern 300 Å Ti/1 µm Al (thin Ti for adhesion) lines on the $SiO_2$ by a lift off technique or mask and etch (metal 1, or M1); thicknesses can be anywhere from 50 Å to 1 µm of Ti and 2000 Å to 3 µm Al. Alternately there can be an antireflective coating on top of Al, typically Ti, TiN, WN, or Cr;
4. Deposit a second $SiO_2$ film 1 micron thick on top of M1; thickness can be anywhere from 200 Å to 10 µm, although in general, it should scale with the thickness of the metal;
5. Deposit a second Ti/Al line, or M2, on top of the second SiO2 film;
6. Deposit a third $SiO_2$ film on top of M2;
7. Deposit a third Ti/Al film M3 on top of the third $SiO_2$ film;
8. Deposit a fourth $SiO_2$ film on top of M3;
9. Pattern the fourth oxide film and dry etch $SiO_2$ to open the vias and pads to M1, M2, & M3;
10. Deposit, pattern, and etch Ti/Al film M4 on top of the fourth $SiO_2$ film; with the pads to M1, M2, and M3 open, M4 will now connect to the lower metal layers. M4 is called the bus line(s). In an embodiment, there are 6 discrete interconnects in M4, allowing n and p connections to the red, green, and blue LED. The LED can be connected in series or parallel at the designer's discretion. If a via connects each die to the bus line, then all LED are connected in parallel. If there are only vias at the first and last (e.g., $72^{nd}$) LED, then the LED are connected in series. Any other combination is also possible (e.g. connect every $3^{rd}$ red LED, so that there are 3 in series, and that group of 3 is connected in parallel to 8 other groups of 3);

11. Deposit a fifth $SiO_2$ film on top of M4; This final $SiO_2$ film forms the passivation;
12. Pattern the tubs, and proceed to dry etch the $SiO_2$;
13. Dry etch 300 μm deep tubs into the Si wafer. The tubs can be skipped (0 um deep, or can be anywhere from 100 to 500 μm deep);
14. After Si etch, electroplate Ni/Ag into the exposed conductive Si. Typical Ni/Ag thicknesses are 300 Å Ni/2000 Å Ag. Nickel thickness can range from 50 Å to 5000 Å, and silver thickness can range from 500 Å to 5 μm;
15. Singulate LED die using sawing or any of the other singulation methods described herein;
16. Die attach by eutectic bonding or by epoxy or silicone adhesive, followed by curing of same;
17. Wire bond, e.g. with Au wire bonds;
18. Encapsulate, e.g. using silicone, which can alternately have a phosphor powder embedded in it, converting the LED's light from one wavelength to another.

Both Al and $SiO_2$ have excellent resistance erosion during silicon etch. When these materials are combined with a thick photoresist and time multiplexed deep silicon etch techniques, there is sufficient margin to etch 300 μm of silicon without significant erosion of features that are masked from the etch. Electroless nickel plating of silicon is an established technique to metallize silicon. Subsequent silver plating the nickel is also an established technique, and allows for the selective plating of the tubs while not plating the $SiO_2$-covered areas. Silicon submounts have advantages in wafer level packaging (high productivity fabrication), superior heat sink capability of silicon compared to more standard composite packages, and better thermal expansion match between silicon and sapphire compared to sapphire and composite packages.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of dicing semiconductor devices, comprising:
depositing a continuous first layer over a substrate, wherein the first layer imparts a compressive stress to the substrate;
etching grooves in the first layer to increase local stress at the grooves compared to stress at the remainder of the first layer located over the substrate;
generating a pattern of defects in the substrate with a laser beam, wherein a location of the defects in the pattern of defects substantially corresponds to a location of at least some of the grooves in the in the first layer;
applying pressure to the substrate to dice the substrate along the grooves; and
further comprising forming light emitting diodes (LEDs) over the first layer prior to the step of etching grooves;
wherein:
the substrate comprises sapphire and the first layer comprises a III-nitride semiconductor layer;
the first layer comprises a GaN buffer layer; and
the step of etching grooves comprises etching street grooves in inactive regions through the LEDs and through the first layer to expose the substrate and to define a pattern of individual LED dies on a first side of the substrate.

2. The method of claim 1, wherein the laser beam is provided onto a second side of the substrate opposite the first side of the substrate.

3. The method of claim 1, wherein the laser beam is provided onto the first side of the substrate through the grooves in the first layer.

4. The method of claim 1, wherein dicing the substrate along the grooves comprises dicing the substrate to generate a plurality of LED dies, and wherein the street grooves and the pattern of defects mimic a pattern of individual LED dies.

5. The method of claim 1, wherein the pattern of defects comprises a region of defects located less than 10 microns below a surface of the substrate.

6. The method of claim 1, wherein each of the LED dies has more than four sides.

7. The method of claim 1, wherein the step of applying pressure to the substrate to dice the substrate along the grooves comprises passing one or more rollers over the substrate.

8. The method of claim 7, further comprising mounting the substrate on a tape prior to passing one or more rollers over the substrate.

9. The method of claim 7, wherein the substrate is cleaved along a non-preferred crystalline cleaving orientation during the step of applying pressure to the substrate to dice the substrate along the grooves.

* * * * *